United States Patent [19]

Isohata et al.

[11] Patent Number: 4,998,134
[45] Date of Patent: Mar. 5, 1991

[54] EXPOSURE APPARATUS

[75] Inventors: Junji Isohata, Tokyo; Koichi Matsushita, Chiba; Hironori Yamamoto, Chigasaki; Makoto Miyazaki, Yokohama; Kunitaka Ozawa, Isehara; Hideki Yoshinari, Yokohama, all of Japan

[73] Assignee: Canon Kabushiki Kaisha, Tokyo, Japan

[21] Appl. No.: 383,086

[22] Filed: Jul. 21, 1989

Related U.S. Application Data

[60] Division of Ser. No. 183,317, Apr. 8, 1988, abandoned, which is a continuation of Ser. No. 106,001, Oct. 7, 1989, abandoned, which is a continuation of Ser. No. 22,549, Mar. 2, 1987, abandoned, which is a continuation of Ser. No. 912,153, Sep. 24, 1986, abandoned, which is a continuation of Ser. No. 854,540, Apr. 22, 1986, abandoned.

[30] Foreign Application Priority Data

Apr. 25, 1985 [JP] Japan .................................. 60-87551

[51] Int. Cl.$^5$ .............................................. G03B 27/42
[52] U.S. Cl. ........................................... 355/53; 355/74
[58] Field of Search ..................................... 355/53, 74

[56] References Cited

U.S. PATENT DOCUMENTS

| 3,716,296 | 2/1973 | Springer et al. | 355/53 |
| 4,068,948 | 1/1978 | Ritzerfeld | 355/75 |
| 4,128,331 | 12/1978 | Nakamura | 355/32 |
| 4,530,587 | 7/1985 | Kosugi et al. | 355/53 |
| 4,589,769 | 5/1986 | Matsuki | 355/71 |

FOREIGN PATENT DOCUMENTS

54-0134565 10/1979 Japan .
57-0183032 11/1982 Japan .
60-0180120 9/1985 Japan .

Primary Examiner—Monroe H. Hayes
Attorney, Agent, or Firm—Fitzpatrick, Cella, Harper & Scinto

[57] ABSTRACT

An apparatus for photolithographically transferring, onto a plate-like member a pattern corresponding to picture elements of a liquid crystal display device and a pattern corresponding to driving circuits and so on, by use of a photomask. The surface of the plate-like member is divided into different areas and, each time one of the different areas of the plate-like member is subjected to the pattern transfer operation, the plate-like member is fed stepwise relative to an optical system provided to project an image of the photomask onto the plate-like member. At the same time, the range of the photomask pattern which is to be transferred onto the plate-like member is changed. By this, a portion of the picture-element pattern and a portion of the circuit pattern are transferred onto each of the different areas on the plate-like member, whereby a large-size pattern contributable to form a large-size display picture plane and a pattern contributable to form a control circuit for controlling the picture plane are transferred on the plate-like member.

8 Claims, 4 Drawing Sheets

EXPOSURE APPARATUS

This application is a division of application Ser. No. 07/183,317 filed Apr. 5, 1988, which is a continuation of application Ser. No. 07/106,001 filed Oct. 7, 1987, which is a continuation of application Ser. No. 07/022,549 filed Mar. 2, 1987, which is a continuation of application Ser. No. 06/912,153 filed Sept. 24, 1986, which is a continuation of application Ser. No. 06/854,540 filed Apr. 22, 1986 (all now abandoned).

FIELD OF THE INVENTION AND RELATED ART

This invention relates to an exposure apparatus for exposing an object such as a plate-like member to a pattern with radiation and, more particularly, to an exposure apparatus such as mentioned above which is very suitable for use, in the manufacture of a large-size flat-panel display device, for transferring a fine pattern onto a large-size plate-like member constituting a portion of the panel display device.

Exposure apparatuses are known, e.g., in the field of manufacture of semiconductor devices such as integrated circuits, as means for photolithographically transferring a fine pattern of a mask or reticule onto a substrate or semiconductive wafer. And, various types of exposure apparatuses, such as contact type, proximity type, mirror projection type, lens projection type, etc., have been developed.

Also in the manufacture of flat-panel display devices such as liquid crystal panel display devices, use is known of such exposure apparatuses as mentioned above in a process of forming a fine pattern on a substrate or glass base plate because of the capability of attaining high resolution. Use of such exposure apparatuses for the need for this purpose however involves difficulties in meeting enlargement of the size of the base plate necessary for allowing manufacture of large-size panel display devices.

SUMMARY OF THE INVENTION

It is accordingly a primary object of the present invention to provide an exposure apparatus suitably usable in the manufacture of large-size flat-panel display devices, by which apparatus a fine pattern contributable for forming the panel display device can be precisely transferred onto a large-size base plate.

Briefly, according to the present invention, there is provided an apparatus, usable with a plate-like member and a mask having a pattern including a first pattern portion contributable to form display elements on a surface of the plate-like member and a second pattern portion contributable to form on the surface of the plate-like member an element serviceable to drive the display elements, for photolithographically transferring the pattern of the mask onto the surface of the plate-like member, said apparatus comprising means for exposing the plate-like member to the pattern of the mask with radiation so that an image of the pattern of the mask is transferred onto one of different regions of the surface of the plate-like member; means for intermittently moving the plate-like member relative to the mask so that the different regions of the surface of the plate-like member are exposed to the pattern of the mask in a predetermined sequence; and means for variably setting the range of the pattern of the mask, to be transferred onto the plate-like member, said setting means setting the range in accordance with the region of the surface of the plate-like member, which region is just going to be exposed to the pattern of the mask, such that images of the first pattern portion of the mask are transferred onto an inner portion of the surface of the plate-like member while images of the second pattern portion of the mask are transferred onto an outer peripheral portion of the plate-like member substantially surrounding the inner portion.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

The invention will first be described in comparison with an exposure apparatus, usable in the manufacture of large-size flat-panel display devices, of the type disclosed in the aforementioned prior U.S. Patent Application having the same assignee as of the present application.

Figure 1:
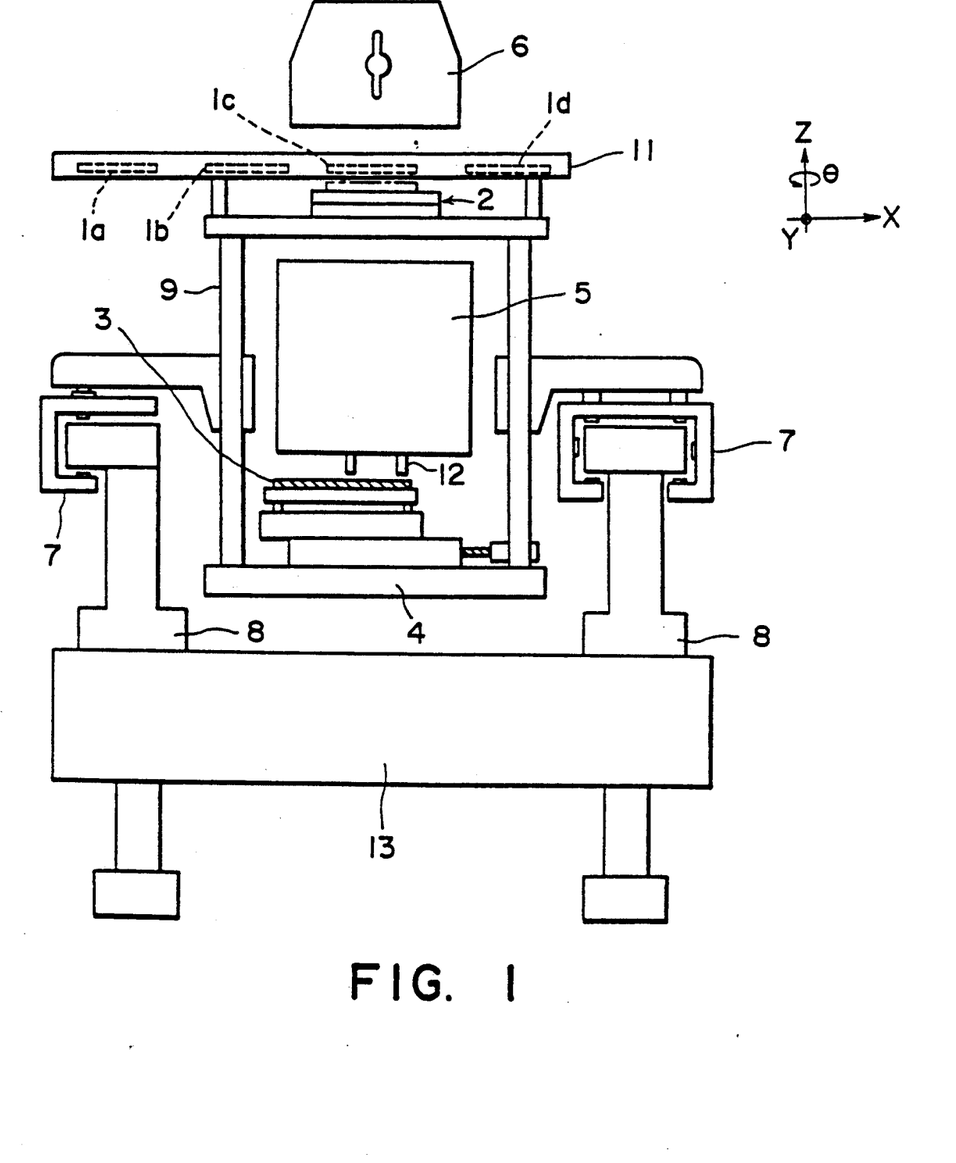
FIG. 1 is a front elevational view schematically showing an exposure apparatus of the type disclosed in a prior U.S. Patent Application based on a Japanese Patent Application filed Apr. 1, 1985 and having the same assignee as of the present application.

For the best understanding of the present invention, reference will first be made to FIG. 1 showing the exposure apparatus of the type disclosed in the aforesaid prior application. As shown in FIG. 1, the exposure apparatus is usable with four photomasks 1 (1a, 1b, 1c and 1d), each having a fine pattern formed on its lower surface. The exposure apparatus includes a mask stage 2 for carrying thereon one of the masks 1a -1d at a time. The mask stage 2 is movable in each of X, Y and θ (rotational) directions for fine adjustment of the position of the mask carried by the mask stage. Denoted in this Figure by numeral 3 is a glass substrate or base plate of rectangular square shape having a diagonal length of an order of fourteen (14) inches. For the manufacture of a liquid crystal panel display device, for example, a number of displaying picture elements as well as switching transistors for controlling actuation and de-actuation of the picture elements, capacitors, connecting terminals and so on are to be formed on the surface of the glass base plate 3 by ordinary photolithographic processes. The glass base plate 3 is held by a base-plate carrying stage 4 which is movable in each of the X, Y and θ (rotational) directions. Also, the stage 4 is arranged to be moved stepwise in each of the X and Y directions, for the sake of plural-shot exposure of the glass base plate 3 as will be described later. Such step-feeding of the stage 4 is controlled by a fine movementmeasuring system using a laser interferometer, not shown. The exposure apparatus further includes a mirror projection optical system 5 of known type, comprising a combination of concave and convex mirrors. The mirror projection system is adapted to project, onto the glass base plate 3 at unit magnification, an image of the pattern of one of the masks 1a–1d which is held at a predetermined position (exposure station) by the mask stage 2. An illumination optical system 6 includes a light source (not shown) for providing light of a predetermined wavelength or wavelength range to illuminate one of the masks held at the predetermined exposure station by the mask stage 2. By exposing a photosensitive layer formed on the glass base plate 3 to light passed through the pattern of the mask held by the mask stage 2, the fine pattern of such mask is photolithographically transferred onto the glass base plate 3. The mirror projection system 5 is disposed such that its optical axis is accurately aligned with the optical axis of the illumination optical system 6.

Denoted by numerals 7 and 7 are linear air-bearing assemblies (hereinafter simply "LAB") which are movable along two guide rails 8 and 8, respectively, extending in the Y direction. One of these bearing assemblies (LAB) is of the type in which it is constrained with respect to movement in the X direction (positive and negative) and in a Z direction (positive and negative). The other of the bearing assemblies is of the type in which it is constrained with respect to movement in the Z direction. A carriage 9 is provided to hold the mask stage 2 and the base-plate stage 4 in a predetermined relation, and is supported by the LAB 7. With this arrangement, the mask 1 carried by the mask stage 2 and the glass base plate 3 carried by the base-plate stage 4 can be scanningly moved as a unit in the Y direction relative to the projection system 5, during the exposure of the mask and the base plate to the light emitted from the illumination optical system 6.

The exposure apparatus further includes a mask feeder 11 for sequentially feeding the masks 1a–1d to the exposure station on the mask stage 2. That is, the mask feeder 11 is arranged to change masks each time the scanning exposure of one of different areas on the glass base plate 3 is completed. Gap sensors denoted by numeral 12 are provided to detect the distance between the surface of the base plate 3 and the focal plane of the projection optical system 5. For example, air-microsensors utilizing air pressure or photoelectric sensors utilizing reflection light from the base plate 3 are usable as the gap sensors. The projection optical system 5, the illumination optical system 6 and the guide rails 8 are supported by a base or surface plate 13 in a predetermined interrelation.

In the exposure apparatus shown in FIG. 1, the surface of the base plate 3 is imagewise divided into four different areas, for example. And, these four shot areas are sequentially placed on the exposure station under the projection optical system 5 in accordance with the step-feeding of the stage 4. By such sequential placement of the four shot areas of the base plate 3, mask patterns are sequentially printed on the base plate 3. That is, four kinds of photomasks 1a–1d such as shown in FIGS. 3A–3D are prepared, in accordance with the shot areas defined on the base plate 3. Each of the masks 1a–1d has a picture-element pattern 32 contributable to form displaying picture elements on the surface of the base plate 3 and another pattern 31 contributable to form on the same surface a driving circuit and/or connecting terminals serviceable to drive the picture elements. And, in response to the movement of the base plate 3 by the stage 4 for sequentially placing the different areas of the base plate 3 at the exposure station, the masks 1a–1d are interchangingly used in the manner that picture-element patterns 32-32 of the masks 1a–1d are transferred onto an inner portion of the surface of the base plate 3, whereas patterns 31-31 corresponding to driving circuits and/or connecting terminals are transferred onto an outer peripheral portion of the base plate 3 surrounding the inner portion. By this, a large-size pattern contributable to form a liquid crystal panel display device can be "printed" on the whole surface of the base plate 3. According to this method, four photomasks are necessary for effecting four-shot exposure (four-division exposure).

Figure 2:
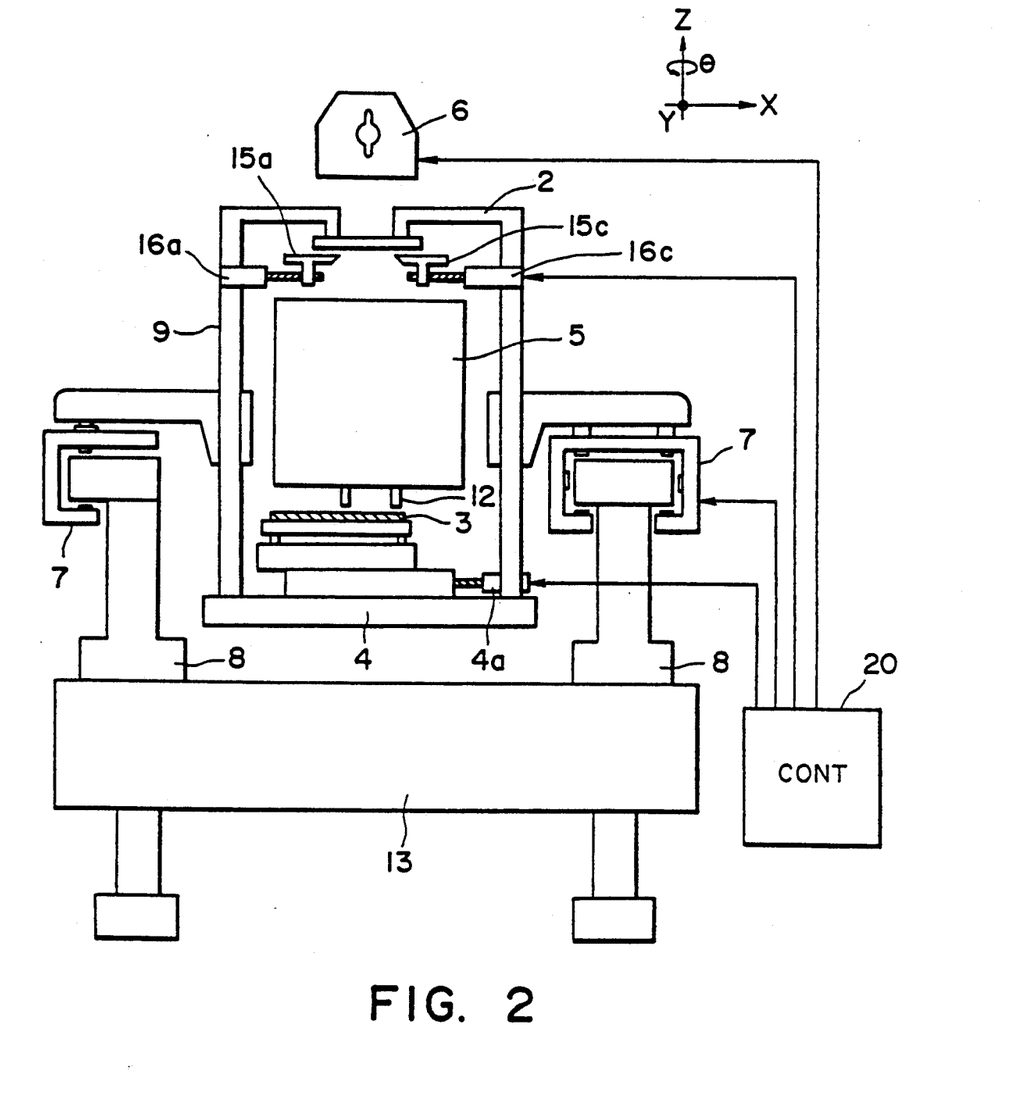
FIG. 2 is a front elevational view schematically and diagrammatically showing an exposure apparatus according to an embodiment of the present invention.

According to the present invention, as compared therewith, only one photomask is necessary for the "plural-shot exposure". Details of this will now be described taken in conjunction with FIG. 2 showing an embodiment of the present invention. In FIG. 2, elements having similar or corresponding functions as of those shown in FIG. 1 are denoted by corresponding numerals.

One of major distinctive features of the present embodiment over the apparatus of FIG. 1 lies in the point that, in the present embodiment, a variable exposure range can be set with respect to the surface of the mask 1. For this purpose, the exposure apparatus of the present embodiment is additionally provided with a blade assembly 15 comprising four blades 15a–15d, which are movable independently from each other so as to variably define the exposure range with respect to the mask 1 surface. Also, there are provided four pulse motors for adjusting the positions of the blades 15a–15d, respectively. While, in FIG. 2, only two blades as denoted by numerals 15a and 15c and only two pulse motors as denoted by numerals 16a and 16c are shown, the remaining two blades 15b and 15c (see FIGS. 4A–4D) and the remaining two pulse motors are actually provided at positions forward and backward of the blades 15a and 15c and the pulse motors 16a and 16c, in the direction perpendicular to the sheet of the drawing. All the four blades and the four pulse motors are supported by the holder or carriage 9. Another distinctive feature of the present embodiment is that the mask feeder 11 shown in FIG. 1 is omitted and, in place thereof, the mask 1 which is used alone in this embodiment is held at the exposure station above the projection optical system 5 in a similar manner as in conventional semiconductor device manufacturing exposure apparatuses. This is because, in this embodiment, the pattern transfer relative to "one layer" on the base plate 3 is effected by use of only one photomask, as will be described later.

Controller 20 is provided to control the operations of the exposure apparatus as a whole. Particularly, it controls energization of the illumination optical system 6, actuation of the pulse motors 16a, 16c, etc., for driving the blades 15a–15d, movement of the carriage 9 with the aid of the LAB 7, actuation of driving motors (one of which is denoted by numeral 4a) for moving the base-plate stage 4, and so on. Also, the controller 20 is operative, each time the base plate 3 is fed stepwise, to effect alignment of one of individual areas on the surface of the base plate 3 with respect to the mask 1, with the aid of an unshown TTL (through the lens) alignment detecting system.

In a liquid crystal display device, displaying picture elements are usually provided by a number of identical minute patterns arrayed in a matrix form, each pattern corresponding to one picture element. So, in the case of four photomasks 1a–1d shown in FIGS. 3A–3D, the same patterns are formed in the picture-element forming pattern regions 32–32 of the masks 1a–1d, other than the regions 31a–31d in which alignment marks, liquid-crystal driving wiring patterns and so on are formed. In consideration thereof, the present embodiment uses a single mask 1 for plural-shot exposure of the base plate 3 for the manufacture of flat-panel display devices. More specifically, in the photomask 1 used in the present embodiment, a pattern contributable for forming picture elements on each of four different shot areas on the base plate is formed in an inner portion 32 of the mask 1, while a pattern contributable for forming a circuit pattern, a wiring pattern, alignment marks, etc. are formed in outer peripheral portions 31a–31d, such as shown in FIGS. 4A–4D. And, upon pattern transfer operation, an unwanted portion or portions of the mask 1 as determined by the shot area on the base plate 3 which is just going to be subjected to the photolithographic pattern transfer, are shielded or covered by appropriate one or ones of the blades 15a–15d. By repeating this for the remaining shot areas on the base plate 3, patterns contributable to form a display device, which patterns are the same as those to be formed by use of the photomasks 1a–1d shown in FIGS. 3A–3D, can be transferred onto the different shot areas on the base plate 3 in a predetermined sequence. For example, upon pattern transfer operation relative to one shot area on the base plate 3 corresponding to the mask 1a shown in FIG. 3A, the peripheral portions 31a and 31b of the mask 1 of the present embodiment are covered by the blades 15a and 15b, such as shown in FIG. 4A. On the other hand, upon pattern transfer operation relative to another shot area on the base plate 3 corresponding to the mask 1b shown in FIG. 3B, the peripheral portions 31b and 31c of the mask 1 of the present embodiment are covered by the blades 15b and 15c, such as shown in FIG. 4B. And, upon pattern transfer operation corresponding to that using the mask 1c shown in FIG. 3c, the peripheral portions 31c and 31d of the mask 1 of the present embodiment are covered by the blades 15c and 15d such as shown in FIG. 4C, whereas, upon pattern transfer operation corresponding to that using the mask 1d shown in FIG. 3D, the peripheral portions 31a and 31d of the mask 1 of the present embodiment are covered by the blades 15a and 15d such as shown in FIG. 4D.

Figure 4A:
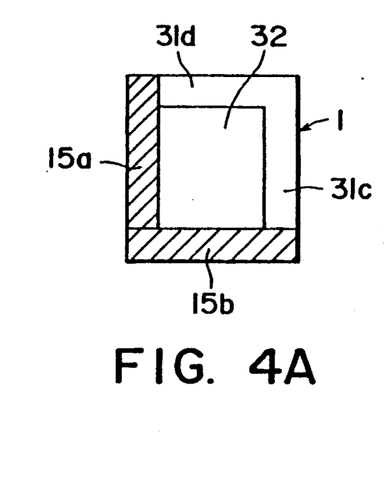
FIGS. 4A-4D are explanatory views, respectively, showing the manner of exposure operation in the exposure apparatus according to the FIG. 2 embodiment.
Figure 4B:
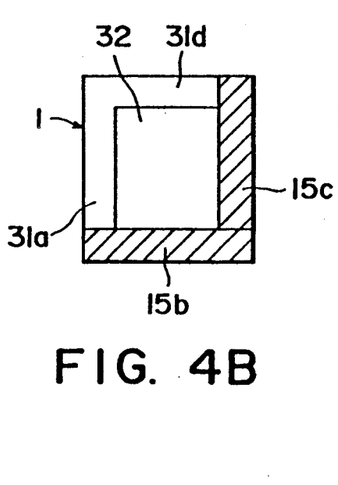
Figure 4C:
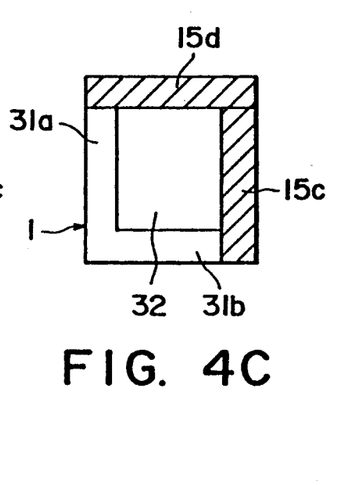
Figure 4D:
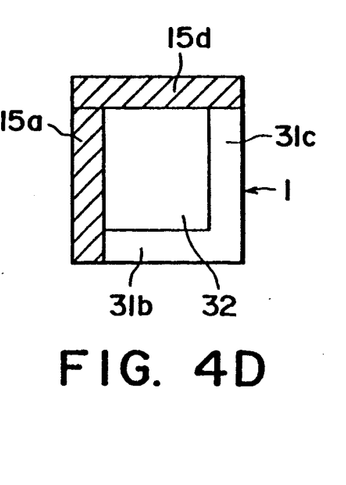
Figure 5:
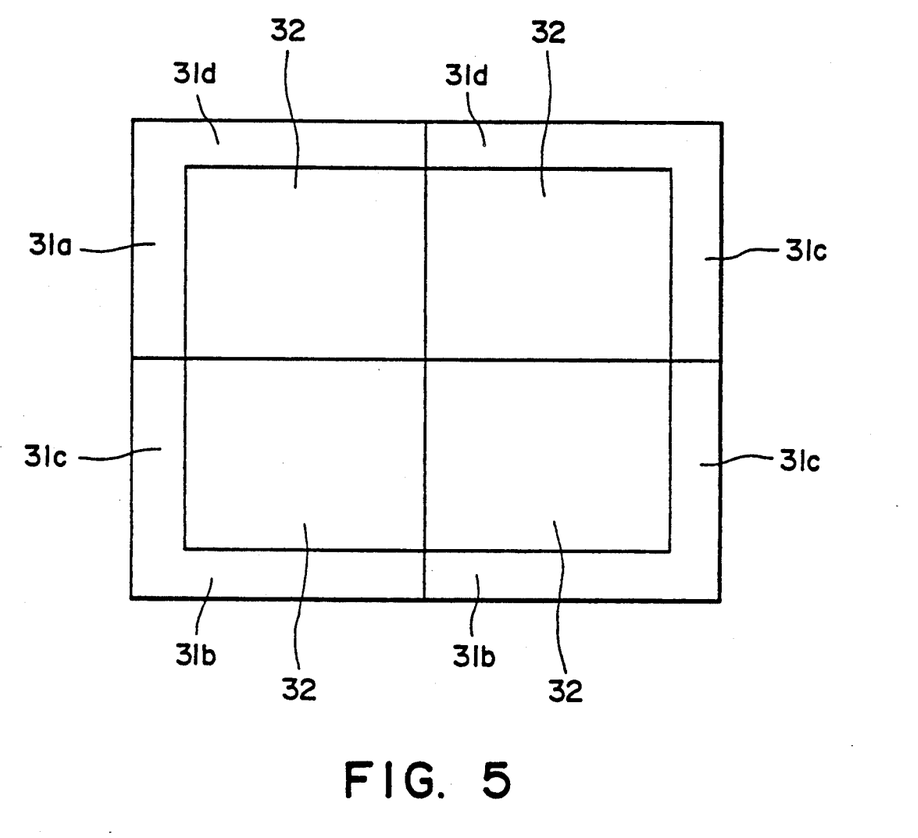
FIG. 5 is a plan view showing patterns transferred onto a plate-like member.

FIG. 5 is a plan view of the base plate 3, showing patterns having been transferred onto the base plate 3 by means of the exposure apparatus shown in FIG. 2 and by use of the mask 1 shown in FIGS. 4A–4D. As will be seen also from FIG. 5, each of the peripheral portions 31a–31d of the mask 1 is used twice for the manufacture of one liquid crystal display device. It is possible and easy to design the liquid crystal display device so as to have two equivalent portions containing circuit patterns, wiring patterns and so on, with respect to the longitudinal direction or horizontal direction as viewed in FIG. 5.

While, in the foregoing, the invention has been described with reference to an exposure apparatus of the mirror projection type, the invention is applicable to other types of exposure apparatus such as the contact exposure type, the proximity exposure type, the lens projection exposure type, etc.

Also, the covering blades which are provided at positions in the neighborhood of the mask 1 and between the mask 1 and the projection system 5 may be disposed in a plane which is between the mask and the light source of the illumination optical system and is defined so as to be optically conjugate with the mask surface. Further, the number of blades is not limited to four, and the four linear blades arranged to define a rectangular exposure range on the surface of the mask may be replaced by a combination of two L-shaped blades which are movable independently from each other so as to cover or shield unwanted portions of the mask 1.

In accordance with the present invention, as has hitherto been described, use of only one mask allows transfer of different patterns. This reduces the number of masks required in the manufacture of a display device of plural-layer structure and, therefore, assures easy handling of the masks. Particularly, the pattern transfer operation relative to "one layer" can be effected by use of only one mask. This avoids cumbersome operations for changing masks and thus for mask alignment as required each time the pattern transfer relative to one of different areas on the base plate is completed. This is very effective to reduce the time necessary for transferring patterns onto the base plate, thus improving the throughput of the exposure apparatus.

While the invention has been described with reference to the structure disclosed herein, it is not confined to the details set forth and this application is intended to cover such modifications or changes as may come within the purposes of the improvements or the scope of the following claims.

What is claimed is:

1. A method of exposure in the manufacture of a panel display device, comprising the steps of:
    preparing a first mask pattern for forming display elements and a second mask pattern for forming an element able to actuate the display elements;
    placing a workpiece having a surface on a movable table;
    variably defining a zone for irradiation of the first and second mask patterns by using movable masking blades, and allowing the first and second mask patterns to be selectively transferred to the workpiece surface;
    moving the movable table so that different portions of the workpiece surface are brought to and positioned at a predetermined exposure station in a predetermined sequence; and
    supplying radiation energy to the variably defined zone so that the first and second mask patterns are selectively transferred to the workpiece surface; and
    interrelating the variable defining of the zone with the moving of the movable table so that plural first mask patterns are printed on a first region of the workpiece surface while plural second mask patterns are printed on a second region of the workpiece surface outside the first region.

2. A method according to claim 1, wherein said first mask pattern preparing provides a liquid crystal display plane on the workpiece surface.

3. A method according to claim 1, further comprising contiguously printing the first mask patterns in the first region.

4. A method of exposure in the manufacture of a panel display device, for exposing different portions of a workpiece with radiation in a predetermined sequence, said method comprising the steps of:
preparing a first mask pattern for forming display elements on the workpiece and a second mask pattern providing an element on the workpiece able to actuate the display elements;
placing the workpiece on a stage;
positioning one portion of the workpiece at an exposure station having an exposure range variably defined by a plurality of masking blades; and
controlling the stage and the masking blades so that plural first mask patterns are printed in a first region of the workpiece while plural second mask patterns are printed in a second region outside the first region.

5. A method according to claim 4, wherein said first mask pattern preparing provides a liquid crystal display plane on the workpiece surface.

6. A method according to claim 4, further comprising contiguously printing the first mask patterns in the first region.

7. An exposure apparatus, comprising:
stage means for supporting a workpiece;
a plurality of masking members arranged to variably define an exposure range in relation to a first mask pattern providing display elements and a second mask pattern providing an element able to actuate the display elements; and
means for controlling said stage means and said masking members so that plural first mask patterns are printed in a first region of the workpiece while plural second mask patterns are printed in a second region of the workpiece outside the first region of the workpiece.

8. An apparatus according to claim 7, further comprising means for contiguously printing the first mask patterns in the first region.

* * * * *

UNITED STATES PATENT AND TRADEMARK OFFICE
CERTIFICATE OF CORRECTION

PATENT NO. : 4,998,134
DATED : March 5, 1991
INVENTOR(S) : Junji Isohata, et al.

It is certified that error appears in the above-identified patent and that said Letters Patent is hereby corrected as shown below:

On the title page:

IN THE RELATED U.S. APPLICATION DATA

"Ser. No. 106,001, Oct. 7, 1989," should read --Ser. No. 106,001, Oct. 7, 1987,--.

IN THE DISCLOSURE

COLUMN 1

Line 37, "the need for" should be deleted; and
Line 38, "meeting enlargement" should read --meeting the need for enlargement--.

COLUMN 4

Line 39, "blades 15b and 15c" should read --blades 15b and 15d--.

UNITED STATES PATENT AND TRADEMARK OFFICE
CERTIFICATE OF CORRECTION

PATENT NO. : 4,998,134

DATED : March 5, 1991

INVENTOR(S) : Junji Isohata, et al

It is certified that error appears in the above-identified patent and that said Letters Patent is hereby corrected as shown below:

COLUMN 5

Figure 3A:
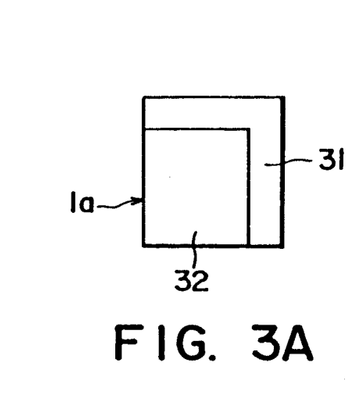
FIGS. 3A-3D are explanatory views, respectively, showing the manner of exposure operation in the apparatus shown in FIG. 1.
Figure 3B:
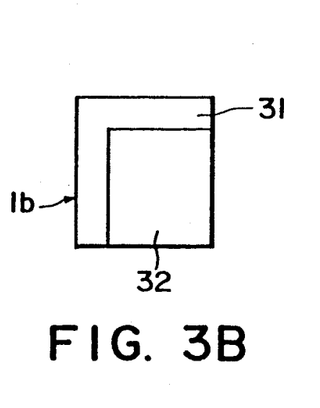
Figure 3C:
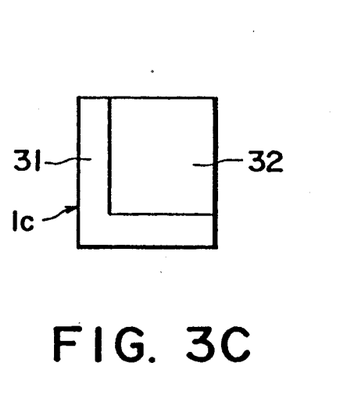
Figure 3D:
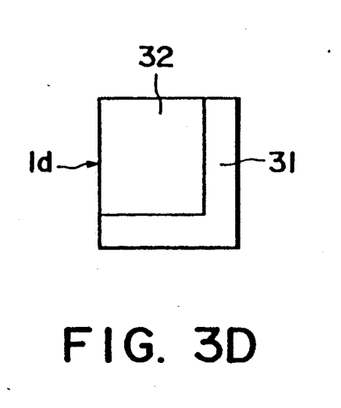

Line 43, "FIG. 3c," should read --FIG. 3C,--.

Signed and Sealed this

Twenty-second Day of September, 1992

Attest:

DOUGLAS B. COMER

*Attesting Officer*    *Acting Commissioner of Patents and Trademarks*